United States Patent
Malladi

(10) Patent No.: US 6,436,737 B1
(45) Date of Patent: Aug. 20, 2002

(54) METHOD FOR REDUCING SOFT ERROR RATES IN SEMICONDUCTOR DEVICES

(75) Inventor: Deviprasad Malladi, Campbell, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/606,466

(22) Filed: Jun. 29, 2000

(51) Int. Cl.$^7$ .............................................. H01L 21/44
(52) U.S. Cl. ..................................... 438/127; 438/106
(58) Field of Search ................................. 438/112, 124, 438/126, 127, 106

(56) References Cited

U.S. PATENT DOCUMENTS

| | | | |
|---|---|---|---|
| 5,395,783 A | * 3/1995 | Baumann et al. | 437/52 |
| 5,701,085 A | 12/1997 | Malladi et al. | 324/754 |
| 5,734,554 A | 3/1998 | Mitty et al. | 361/697 |
| 5,913,131 A | * 6/1999 | Hossain et al. | 438/423 |
| 5,972,736 A | 10/1999 | Malladi et al. | 438/118 |
| 6,066,509 A | 5/2000 | Akram et al. | 438/51 |
| 6,075,261 A | * 6/2000 | Hossain et al. | 257/252 |
| 6,239,479 B1 | * 5/2001 | Hwang et al. | 257/659 |

OTHER PUBLICATIONS

"Cahners EDN Access, design feature, Heat–sink–attachment methods optimize thermal performance", Located at http://www.ednmang.com/ednmag/reg/1999/090299/18ms556.htm, printed Jun. 7, 2000, 4 pages.

Lau, John H.; "Chapter 1, Part One, A Brief Introduction to Flip Chip Technologies for Multichip Module Applications", Located at http://smtnet.com/bookstore/publications/0–07–036609–8/ch1p1.html.

"Heat Transfer Fundamentals", Located at http://www.chomerics.com/thermal.html, printed Jun. 7, 2000, 4 pages.

"Semiconductor Process Engineering, How Semiconductor Memory Chips are Made", Located at http://www.micron.com/mti/hr/education/present/mathapps/chips.htm, printed Jun. 7, 2000, 5 pages.

Baumann, Robert; Hossain, Tim; Murata, Shinya; Kitagawa, Hideki; "Boron Compounds as a Dominant Source of Alpha Particles in Semiconductor Devices", ULSI Technology Development Center, Texas Instruments Japan Limited, pp. 297–302.

Srinivasan, G.R.; Murley, P.C.; Tang, H.K.; "Accurate, Predictive Modeling of Soft Error Rate Due to Cosmic Rays and Chip Alpha Radiation",IEEE/IRPS, Ch3332–4/940000–0012, pp. 12–16.

Baumann, Robert, C.; Smith, Eric, B.; "Neutron–Induced Boron Fission as a Major Source of Soft Errors in Deep Submicron SRAM Devices" IEEE,DOCH3759, 34th Annual International Reliability Physics Symposium, San Jose, California, 2000, pp. 152–157.

Gel Products Glossery, Thermal Management Definitions; Located at http://gels.raychem.com/defin1.html, printed Jun. 7, 2000, 3 pages.

"Semiconductor Process Engineering, How Semiconductor Memory Chips are Made, Semiconductor Industry Glossary", Located at http://www.micron.com/mti/hr/education/present/mathapps/glossary.htm; printed Jun. 7, 2000, 4 pages.

* cited by examiner

*Primary Examiner*—Michael J. Sherry
*Assistant Examiner*—Scott Geyer
(74) *Attorney, Agent, or Firm*—Rosenthal & Osha L.L.P.

(57) ABSTRACT

A method for reducing soft error rates in semiconductor devices includes adding an isotopically enriched $^{11}$B compound during the manufacture of a semiconductor device. Such isotopically enriched $^{11}$B compounds include orthoborates (BOR$_3$), acyl borates (B(OCOR)$_3$), peroxo borates (OOR)$_3$, boronic acids (RB(OH)$_2$), boron halides, boron hydrides, inorganic boranes, amine boranes, aminoboranes, carboranes, and borazines, where R is an alkyl group. Disclosed uses include adding between 1% to 100% of the isotopically enriched $^{11}$B compound to an underfill material in flip-chip assembly; adding between 1% to 100% of the isotopically enriched $^{11}$B compound to an encapsulent; and adding between 1% to 100% of the isotopically enriched $^{11}$B compound to an adhesive.

35 Claims, 11 Drawing Sheets

METHOD FOR REDUCING SOFT ERROR RATES IN SEMICONDUCTOR DEVICES

BACKGROUND OF THE INVENTION

As the operating voltages and size of semiconductors continue to shrink to satisfy the demand for low power, high density semiconductor devices are being used more widely. However, high density semiconductor devices have a higher sensitivity to ionizing radiation. This phenomenon has been studied and is the subject of several papers, including several by Robert Baumann et al. The papers are "Neutron-Induced Boron Fission as a Major Source of Soft Errors in Deep Submicron SRAM Devices" and "Boron Compounds as a Dominant Source of Alpha Particles in Semiconductor Devices." Ionizing radiation can be defined as any electromagnetic or particulate radiation that produces ion pairs when passing through a medium. An ion, generally speaking, is simply any atom or molecule which has a resultant electric charge due to loss or gain of electrons. The charge created by the formation of the ion pairs can, upon interaction with the semiconductor device cause a disruption in an electrical signal or can corrupt information stored in localized nodes on the device. Such a failure is referred to in the art as a "soft error" because only the data are corrupted while the circuit itself remains unaffected. Other sources of soft errors include electrical noise such as bit-line coupling, and other electronic effects such as cross-talk.

Prior research has focused on determining the sources of this ionizing radiation in an attempt to understand the effect of these sources on the soft error rate (SER). Three major sources of ionizing radiation have been determined. These sources are radiation from Alpha-particle emitting impurities, radiation from Cosmic Rays, and radiation from neutron capture by boron. Each source is discussed separately below.

Radiation from Alpha-particle Emitting Impurities

A significant source of ionizing radiation in semiconductor devices is the result of naturally occurring radioactive particles in semiconductor materials themselves. The major radioactive impurities are uranium (the elemental symbol for which is U) and thorium (the elemental symbol for which is Th), and their progeny. $^{238}$U and $^{232}$Th both decompose to isotopes of lead, which are stable. During the decay process, $^{238}$U emits eight alpha particles, while $^{232}$Th emits six. $^{238}$U and $^{232}$Th are found throughout the materials used in the fabrication of semiconductors. They can be found in the gold used for bond wires and lid plating, filler compounds, interconnect metals, various alloys, etc. Their presence has a small, but detectable effect on the occurrence of soft errors.

Radiation from Cosmic Rays

Cosmic rays are extremely energetic particles moving through the universe at a speed near the speed of light. As these extremely energetic particles move through the earth's upper atmosphere, they collide with other particles and form secondary particles. These secondary particles include neutrons (which are uncharged particles), protons (which are positively charged particles), and electrons (which are negatively charged particles). These secondary particles can cause disturbances in the semiconductor device directly or indirectly. Direct interference can occur when one or more of the secondary particles contacts the semiconductor device and has been found to be a minor effect on soft errors. Indirect interference occurs when the neutrons cause alpha particle emission indirectly, as is explained below.

Radiation from Neutron Capture by Boron

The third, and most significant source of ionizing radiation affecting soft errors is indirect radiation induced from the interaction of the neutrons generated by cosmic rays with boron (the elemental symbol for which is B). Boron is used extensively in semiconductor assembly as a p-type dopant. A p-type dopant is an atom introduced in small quantities into a crystalline semiconductor where the atom attracts electrons. In this way "holes" are produced which effectively become positive charge carriers. Boron is also used in the formation of borophosphosilicate glass (hereafter BPSG) that is deposited on the surface of the silicon wafer during processing.

Boron, as it occurs naturally, has two isotopes, $^{11}$B and $^{10}$B. In naturally occurring boron, approximately 80% of boron atoms are $^{11}$B, and the remaining 20% are $^{10}$B. Upon absorbing a neutron (such as the neutrons generated by the influx of cosmic rays into the upper atmosphere) $^{10}$B fragments, or "fissions," into an excited $^{7}$Li nucleus and an alpha particle. Both the excited $^{7}$Li nucleus and the alpha particle are capable of causing soft errors. It has been shown that, based on the amounts of boron commonly used in semiconductor manufacturing, neutron capture by $^{10}$B can cause 0.02 soft error events per hour. This rate roughly corresponds to one event every two days. Thus, the neutron capture by $^{10}$B can be a significant source of errors in computers. It has been shown that $^{11}$B is significantly less likely to undergo a fission reaction similar to $^{10}$B. $^{11}$B does absorb the neutrons, however, it does so without undergoing the fission reaction.

In order to determine how to reduce the occurrence of soft errors due to ionizing radiation and electronic noise, some understanding of the semiconductor assembly process is needed.

Integrated Circuit Packages

Two common techniques for electronically coupling an integrated circuit to an integrated circuit package are wire bond connections and flip-chip connections. Wire bond connections are the most common used in the microelectronics industry. The wire bonding process starts by mounting an integrated circuit to a substrate with its inactive backside down. Wires are then bonded between an active front side of the integrated circuit and the integrated circuit package.

U.S. Pat. No. 5,972,736, issued to Malladi et al., and assigned to the assignee of the present invention, discloses an integrated circuit package using the wire bonding process. Prior art FIG. 1 illustrates the components of an integrated circuit package. In FIG. 1, a package body 22 includes one or more land areas (not shown) having exposed electrical pads for wire bonding between a semiconductor die 28 and the land areas. The package body 22 may be formed from a variety of materials, such as alumina, glass-ceramic, and polymers with appropriate metal interconnection layers. The land areas are connected by a conductive pattern to areas to which solder balls 42 are affixed allowing for the later surface mounting of the completed device to a printed circuit board or other substrate. Attached to the package body 22 is an attachment mechanism 146. Various materials are used for the attachment mechanism 146, including copper, aluminum, various alloys, and plastics. The attaching mechanism 146 is attached to the package body 22 by a low softening temperature adhesive 134.

The next step in the assembly process is the die attach operation. In this step, semiconductor die 28 is attached to the attachment mechanism 146 utilizing a die attach adhesive 138. Typical die attach adhesives 138 include epoxy, polyamides, metal filled polymers, ceramic filled polymers, diamond filled polymer, silver glass, or other suitable materials. After the semiconductor die 28 is attached to the attachment mechanism 146, wire bonding is performed so that a plurality of wire bonds 30 are formed between the electrical interconnects on package body 22 and bond pads (not shown) on semiconductor die 28. Next, the semiconductor die 28 and bond wires 30 are encapsulated by applying a suitable encapsulating material 49 such as an epoxy. The encapsulation material 49 serves to protect semiconductor die 28 and bond wires 30 as well as attaching semiconductor die 28 to package body 22 allowing the removal of the attachment mechanism 146.

FIG. 2 illustrates the device 140 after removal of the attachment mechanism 146 and the addition of a heat sink (not shown). In FIG. 2, the attachment mechanism 146 has been removed by heating above the softening temperature of the low softening temperature adhesive 134. The heat sink is then attached to the backside of semiconductor die 28 and package body 22 using a single layer of high thermal conductivity adhesive (not shown). The high thermal conductivity adhesive may be an epoxy or polyurethane, a thermal grease (wherein mechanical clamps are used to hold heat sink), or other thermoplastic materials with melting points of less than 200° C.

A second method of preparing an integrated circuit package is known as flip-chip assembly. A flip-chip is a semiconductor chip (die) having bumps on the bond pads formed on the active circuit, where the bumps are used as electrical and mechanical connectors. The die is then inverted and bonded to a substrate by means of the bumps. Several materials are commonly used to form the bumps on the die, such as conductive polymers or metal (solder bumps). If the bumps are solder bumps, the solder bumps can be used to form a solder joint between the die and the substrate. Regardless of how the die is attached to the substrate, a gap exists between the die and the surface of the substrate. Stress develops in the joints formed by the substrate bumps between the die and substrate because the die and the substrate have different coefficients of thermal expansion, different operating temperatures, and different mechanical properties. Therefore, in order to enhance the integrity of the joint, an underfill material is introduced into the gap between the substrate and die. The underfill material may be a variety of materials, such as aluminum oxide, silicon oxide, or polymeric materials. U.S. Pat. No. 6,066,509, issued to Akram et al., for example, discloses methods of filling the gap with underfill material. Prior art FIGS. 3a, 3b, and 3c show a flip-chip having an underfill material.

In FIG. 3a, a substrate 1 and a flip-chip 2 having bumps 4 are shown. FIG. 3b illustrates the result of connecting the substrate 1 to the flip-chip 2 by conventional direct chip bonding techniques such as soldering. Substrate 1 is typically made of ceramic, silicone, glass, and combinations thereof. In FIG. 3b, an electrical assembly is produced by placing and securing the flip-chip 1 on the top surface 8 of the substrate 1 having active circuitry thereon. Specifically, the bumps 4 are aligned with the contact pads (not shown) of the active circuitry located on the top surface 8 of substrate 1. The flip-chip 2 is then electrically and mechanically connected to the substrate 1 by curing or reflowing the bumps 4, depending on the type of material used. This process creates a gap 6 that is typically filled, in order to reduce stress. FIG. 3c illustrates that an underfill material 3 may be applied to fill the gap 6 between the flip-chip and the substrate 1.

Invariably, because of the wide variety of materials used in manufacturing a chip some alpha particle emissions will result, from a wide variety of sources.

BRIEF SUMMARY OF THE INVENTION

In one aspect, the invention relates to a method for reducing soft error rates in semiconductor devices, where the method includes adding an isotopically enriched $^{11}B$ compound when manufacturing the semiconductor device. Such compounds include orthoborates $(B(OR)_3)$, acyl borates $(B(OCOR)_3)$, peroxo borates $(B(OOR)_3)$, boronic acids $(RB(OH)_2)$, boron halides, boron hydrides, inorganic boranes, amine boranes, aminoboranes, carboranes, and borazines, where R is an alkyl group.

In one aspect, the invention relates to adding between 1% to 100% of isotopically enriched $^{11}B$ compound to an underfill material in flip-chip assembly.

In one aspect, the invention relates to adding between 1% to 100% of isotopically enriched $^{11}B$ compound to an encapsulent.

In one aspect, the invention relates to adding between 1% to 100% of isotopically enriched $^{11}B$ compound to an adhesive.

In one aspect, the invention relates to adding between 1% to 100% of isotopically enriched $^{11}B$ compound to a substrate.

In one aspect, the invention relates to using a boron/polymer composite as a packaging material.

In one aspect, the invention relates to using $^{11}B$ as a dopant.

Other aspects and advantages of the invention will be apparent from the following description and the appended claims.

DETAILED DESCRIPTION OF THE INVENTION

Figure 1:
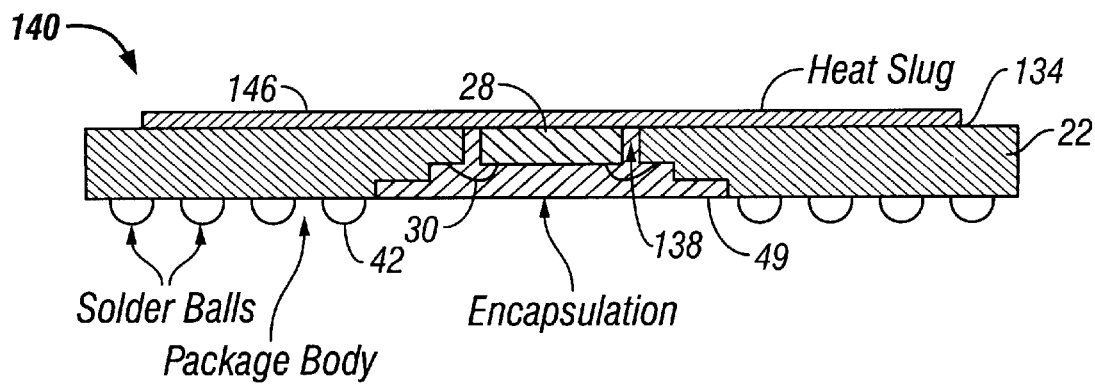
FIG. 1 is a prior art illustration of wire bond technology.
Figure 2:
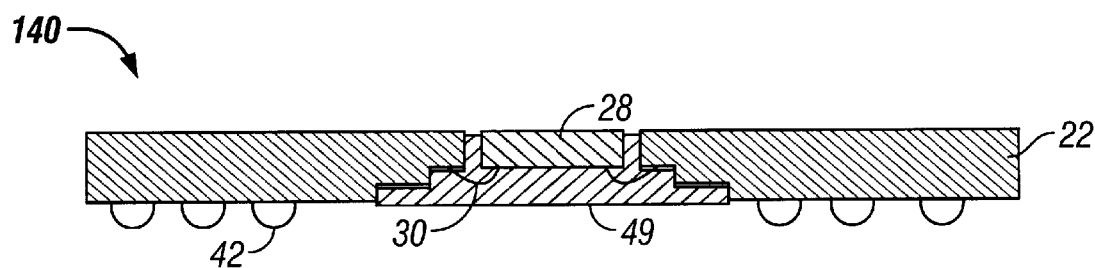
FIG. 2 is a prior art illustration of wire bond technology.
Figure 3A:
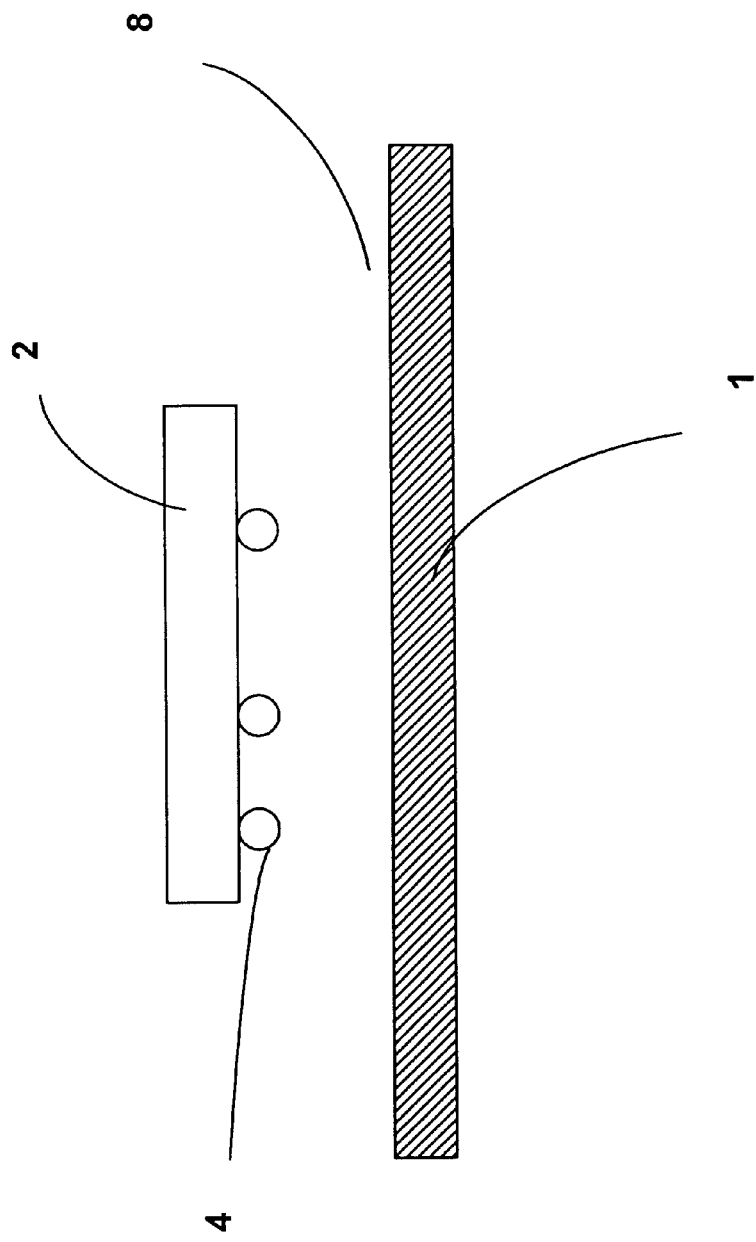
FIG. 3a is a prior art illustration of flip-chip technology.
Figure 3B:
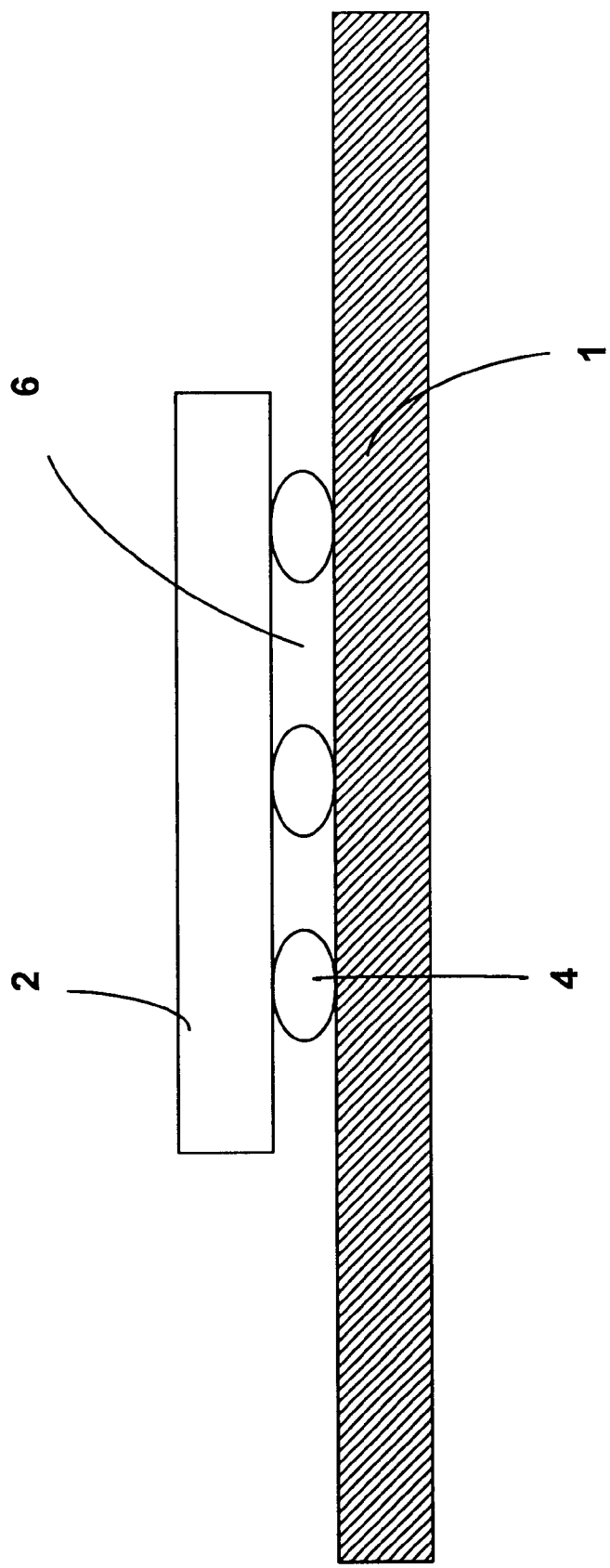
FIG. 3b is a prior art illustration of flip-chip technology.
Figure 3C:
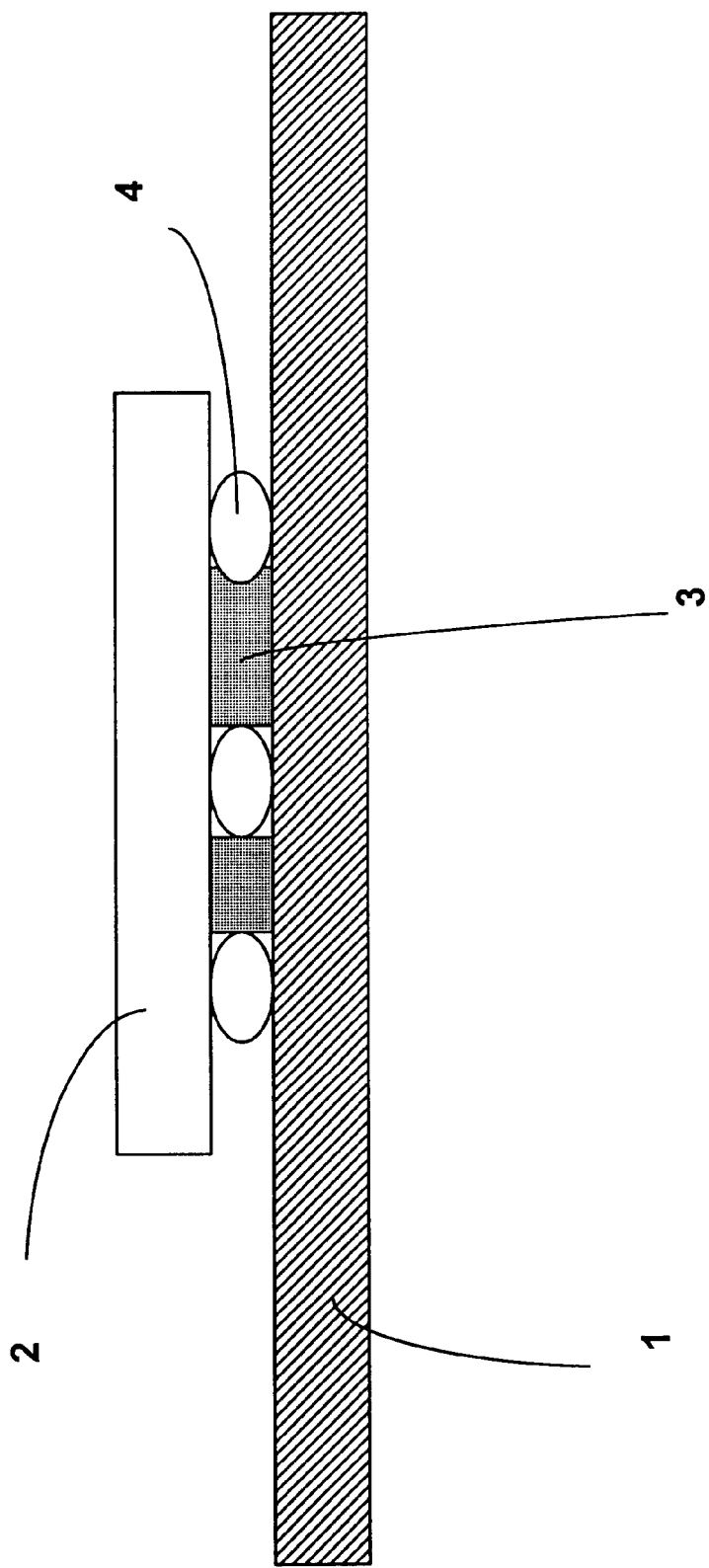
FIG. 3c is a prior art illustration of flip-chip technology.
Figure 4A:
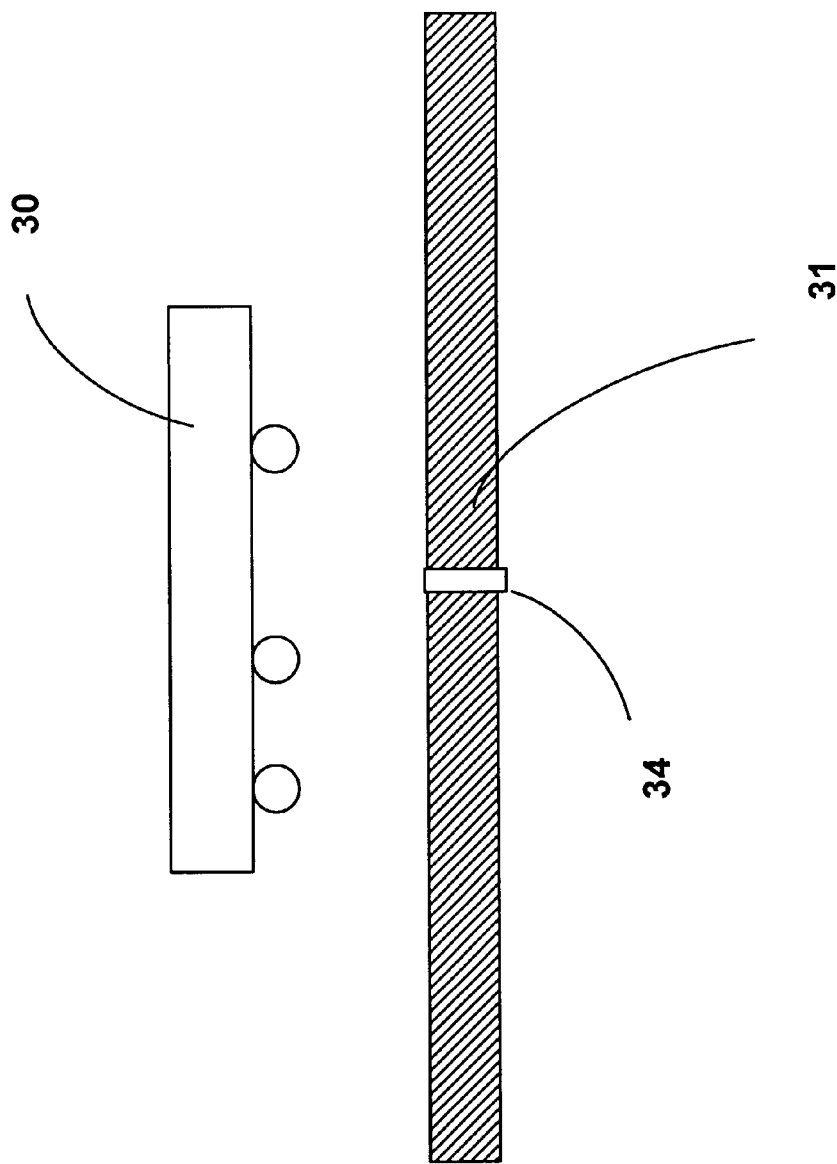
FIG. 4a illustrates an embodiment of the current invention.
Figure 4B:
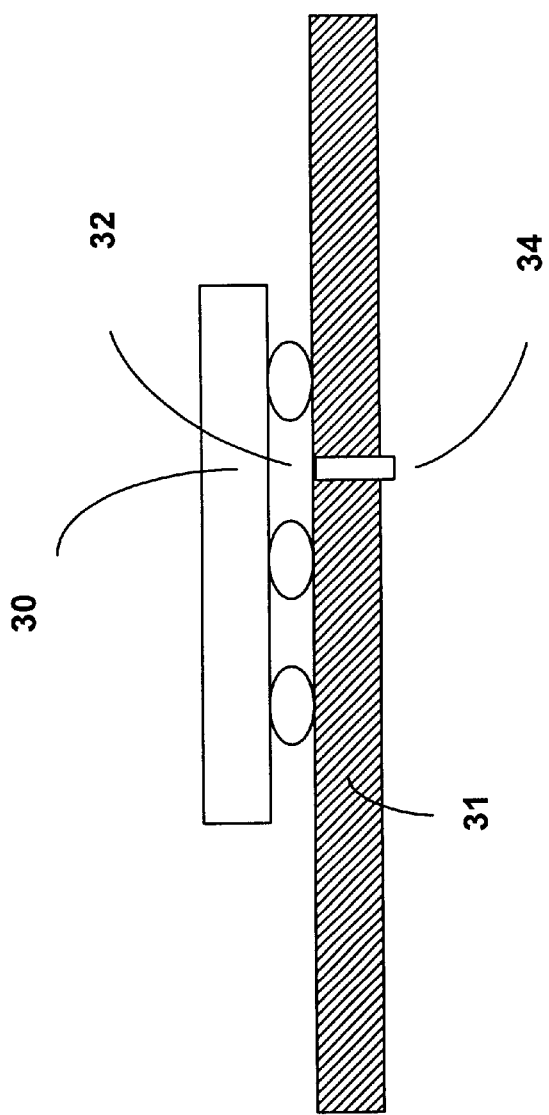
FIG. 4b illustrates an embodiment of the current invention.
Figure 4C:
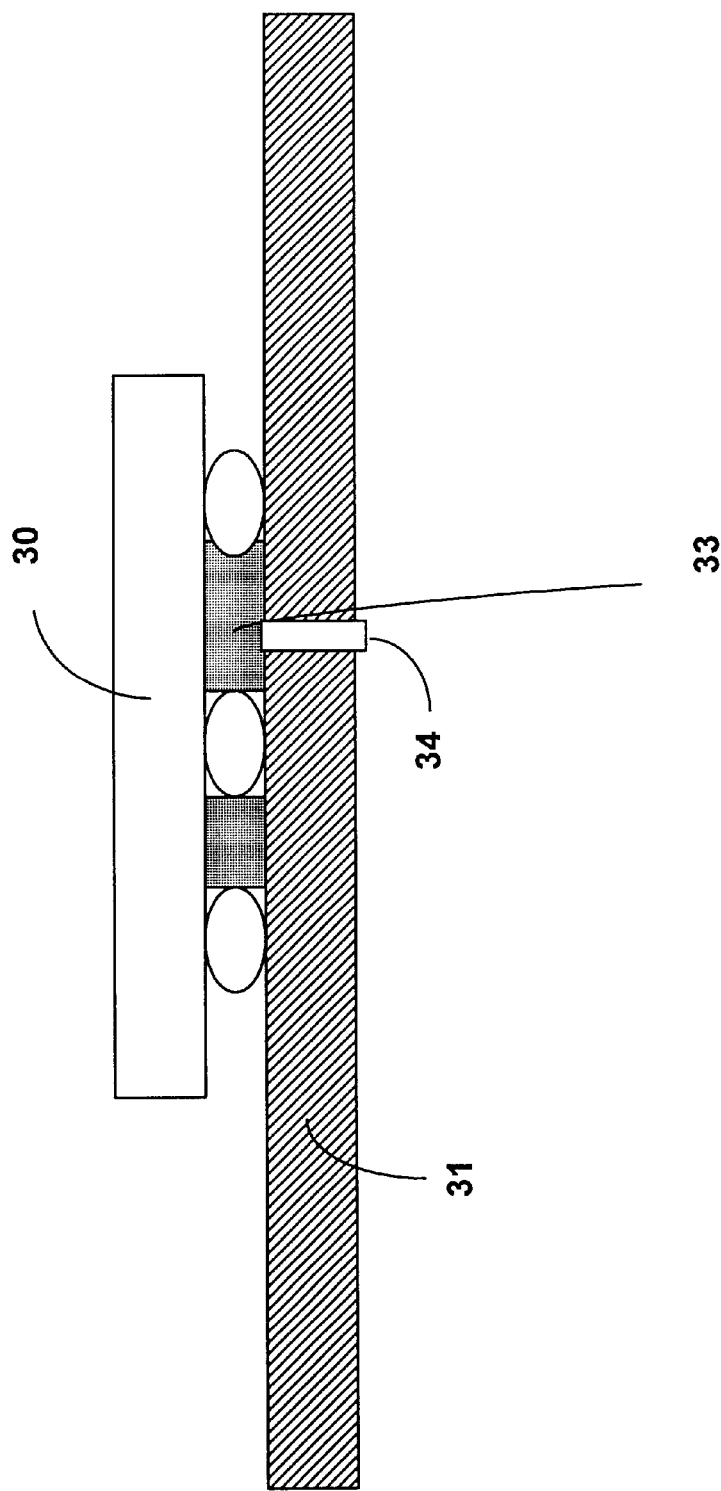
FIG. 4c illustrates an embodiment of the current invention.

In one embodiment, the invention includes using isotopically enriched $^{11}B$ as an underfill material in flip-chip manufacturing. Isotopically enriched $^{11}B$ (containing greater than approximately 95% $^{11}B$) can be obtained commercially in several forms. For example, $^{11}B_2O_3$ ($^{11}B$ oxide) can be obtained from the Aldrich Chemical Company, St. Louis, Mo. FIGS. 4a, 4b, and 4c illustrate one embodiment of the current invention. In FIG. 4a, a flip-chip 30 having a hole 34 and a substrate 31 are illustrated. FIG. 4b illustrates the flip-chip 30 and the substrate 31 after being soldered together, generating a gap 32. There are several methods by which $^{11}$B oxide 33 may be introduced, such as "backfilling" the gap 32 between the substrate 31 and the flip-chip 30 through a small hole 34 in the underside of the substrate. FIG. 4c illustrates the result of backfilling. $^{11}$B oxide 33 may be introduced in place of traditional underfill material, or may be introduced as a mixture. It should be noted, however, that a variety of $^{11}$B compounds can be created through common chemical techniques. For example, elemental $^{11}$B can be heated in the presence of ammonia to generate polymeric $(^{11}BN)_x$, which is suitable for this process. Additionally, elemental $^{11}$B can be incorporated into a polyethylene polymer, yielding a borated plastic. This type of polymer-boron composite is commercially available from Reaction Experiments Inc., in Sunnyvale, California. Boric acid may be obtained as a powder from the hydrolysis (reaction with water) of boron trihalides. The boric acid can then be heated, in the presence of silica to generate a borosilicate glass, which also may be suitable for this application. The borosilicate glass may also be used as a substrate for the flip-chip 30. Additionally, many other standard boron containing compounds may be used. For example, a variety of boron trihalides and their associated products, such as their diethyletherates, may be used. Boron trifluoride exists as a gas at standard temperature and pressures, but reacts with diethyl ether to generate $(C_2H_5)_2OBF_3$ (a viscous liquid) which may be used as an adhesive in many semiconductor applications. The main restriction is that the compounds need to be inert to the atmosphere, which prevents the use of certain boron hydrides.

Figure 5:
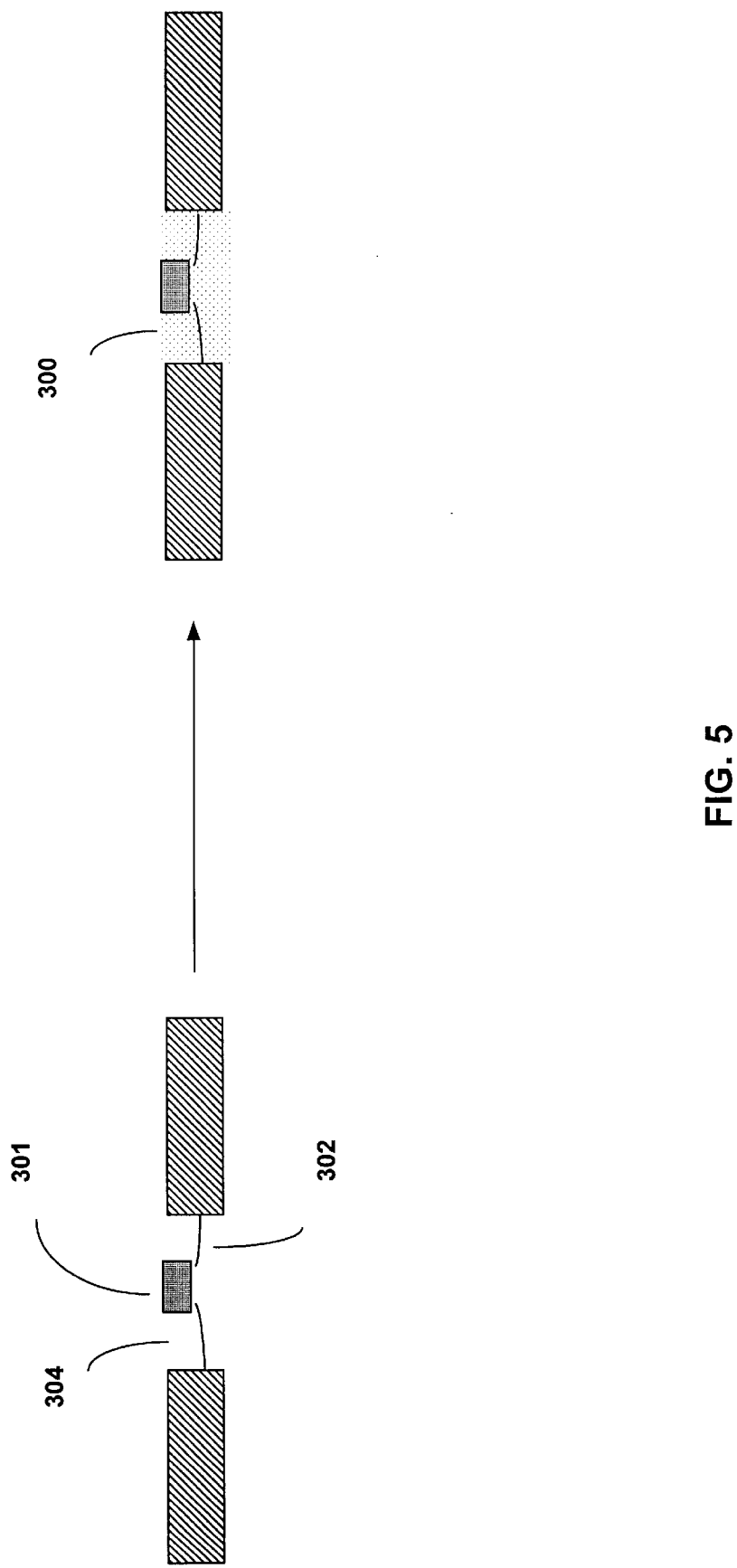
FIG. 5 illustrates an embodiment of the current invention.

FIG. 5 shows another embodiment of the invention. In FIG. 5, a $^{11}$B compound is used alone or in combination with other materials to form encapsulent 300. The encapsulent 300 is added during the assembly process. The encapsulent 300 is injected into a space 304 surrounding a semiconductor die 301 and bond wires 302. The encapsulent 300 is typically an epoxy that can be made solely from a $^{11}$B compound, or $^{11}$B may be admixed with a general epoxy, such as polymers formed by the reaction of epichlorohydrin and bisphenol A. Other materials are possible for this application as well, such as polyethylene, which can be obtained in a borated form as described above. In this embodiment, the $^{11}$B forms a "screen" that protects the surface of the semiconductor die 301 from neutron bombardment.

Figure 6:
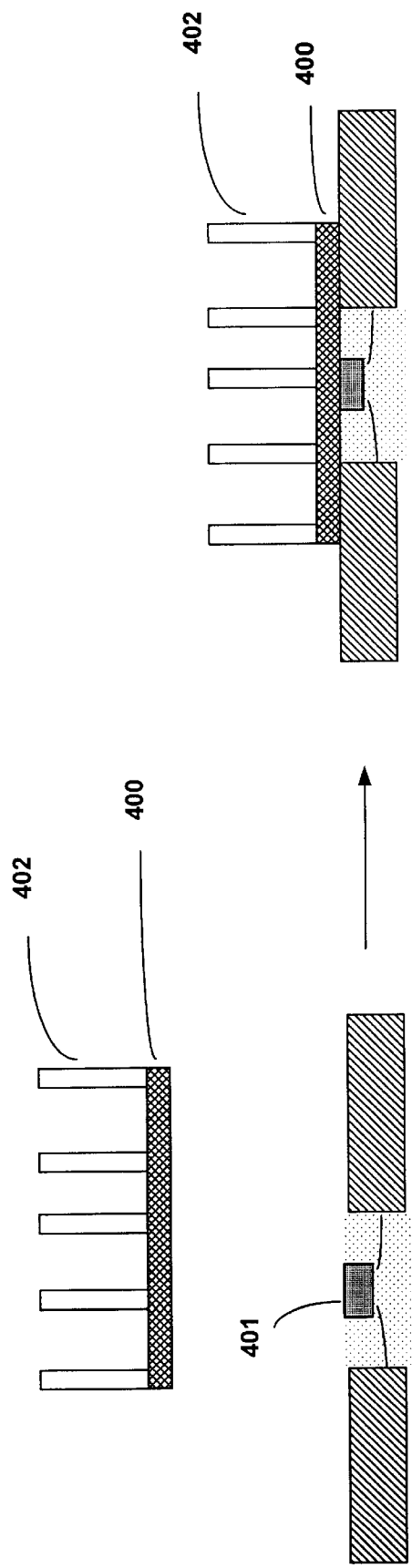
FIG. 6 illustrates an embodiment of the current invention.

FIG. 6 shows another embodiment of the invention, in which an isotopically enriched $^{11}$B compound is added as a heat sink attachment 400 on the back of a die 401. In this example, a heat sink 402 is attached to the backside of die 401 using the heat sink attachment 400. The heat sink attachment 400 is typically a high thermal conductivity adhesive, such as polyurethane, a thermal grease, or other type of plastic. An isotopically enriched $^{11}$B compound may be used in place of, or in conjunction with, any standard manufacturing materials. Isotopically enriched, refers to compounds where the relative abundance of $^{11}$B to $^{10}$B is at least 95:5. It is possible, for example, to use borated polyethylene in this application, or $^{11}$B may be incorporated into a polyurethane matrix.

Figure 7:
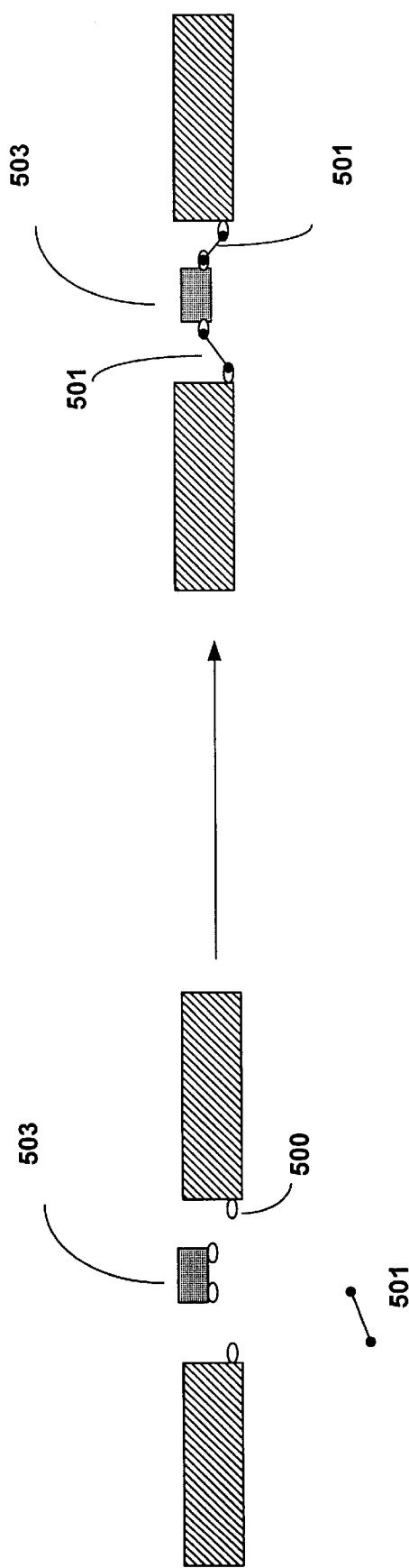
FIG. 7 illustrates an embodiment of the current invention.

FIG. 7 illustrates another embodiment of the invention. FIG. 7 shows a use of $^{11}$B compounds as die attach adhesives for wire bonds. In FIG. 7, a $^{11}$B containing compound 500 is used to attach a plurality of wire bonds 501 to a package body 502 and to a semiconductor die 503, forming mechanical and electrical connections. As is described in the above examples, a variety of isotopically enriched $^{11}$B compounds may be suitable for this application.

Figure 8:
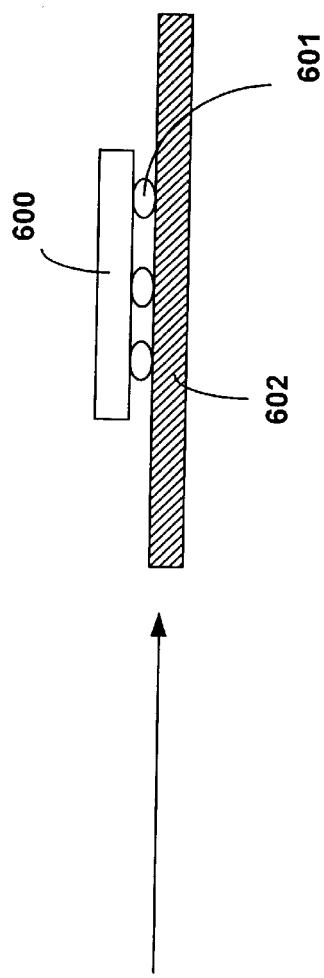
FIG. 8 illustrates an embodiment of the current invention.
Figure 8:
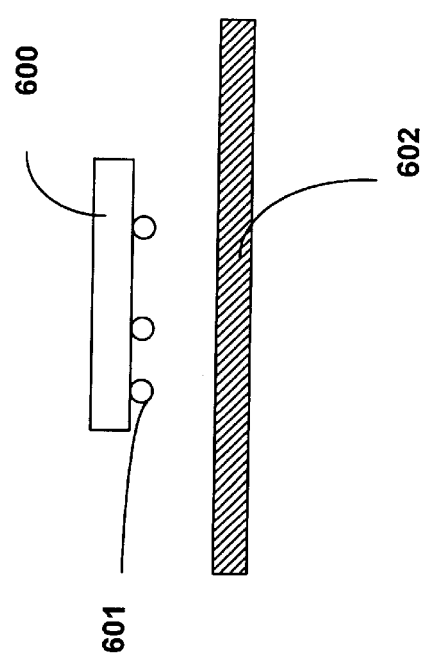

FIG. 8 illustrates another embodiment of the invention. In FIG. 8, an isotopically enriched $^{11}$B compound is used to form a bond between a semiconductor die and a substrate. This application is directed to applications with "flip-chips". In FIG. 8, a semiconductor die 600 has a plurality of isotopically enriched $^{11}$B compounds which function as bumps 601. The bumps 601, may be any suitable $^{11}$B compound as described in the previous examples. For example, the bumps 601 may be composed of boron carbide ($^{11}B_4C$) and heated to form an amorphous gel that can be used to adhere the semiconductor die 600 to a substrate 602. The substrate 602 may be another $^{11}$B containing compound, such as BPSG, thus enhancing the "screening" properties of the $^{11}$B material.

An isotopically enriched $^{11}$B compound may be used in place of, or as a mixture in, any of the standard materials used in the fabrication of semiconductors. The use of isotopically enriched $^{11}$B compounds provides a screen against incoming sources of ionizing radiation, as well as preventing the aforementioned neutron capture problems of $^{10}$B. For example, in another embodiment, a borated plastic that contains isotopically enriched $^{11}$B may be used as the packaging material for the semiconductor. In another embodiment, $^{11}$B may be used as the p-type dopant used in a semiconductor die.

Those skilled in the art will appreciate that other embodiments of the invention can be devised which do not depart from the spirit of the invention as disclosed herein. Accordingly, the scope of the invention should be limited only by the attached claims.

What is claimed is:

1. A method for reducing soft error rates in semiconductor devices, the method comprising:
    adding between 1% to 100% of isotopically enriched $^{11}$B compound to an underfill material.

2. The method of claim 1, wherein the isotopically enriched $^{11}$B compound comprises a compound containing at least 95% $^{11}$B.

3. The method of claim 1, wherein the isotopically enriched $^{11}$B compound comprises a $^{11}$B borated polyethylene compound.

4. The method of claim 3, wherein the borated polyethylene compound contains approximately 5% boron by weight.

5. The method of claim 1, wherein the isotopically enriched $^{11}$B compound comprises a boron oxide.

6. The method of claim 1, wherein the isotopically enriched $^{11}$B compound comprises a boron trihalide.

7. The method of claim 1, wherein the isotopically enriched $^{11}$B compound comprises a boron diethyletherate.

8. The method of claim 1, wherein the isotopically enriched $^{11}$B compound comprises a compound selected from the group consisting of: orthoborates ($B(OR)_3$), acyl borates ($B(OCOR)_3$), peroxo borates ($B(OOR)_3$), boronic acids ($RB(OH)_2$), boron halides, boron hydrides, inorganic boranes, amine boranes, aminoboranes, boron-polymer composites, carboranes, and borazines, where R is an alkyl group.

9. A method for reducing soft error rates in semiconductor devices, the method comprising:
    adding between 1% to 100% of isotopically enriched $^{11}$B compound to an encapsulent.

10. The method of claim 9, wherein the isotopically enriched $^{11}$B compound comprises a compound containing at least 95% $^{11}$B.

11. The method of claim 9, wherein the isotopically enriched $^{11}$B compound comprises a $^{11}$B borated polyethylene compound.

12. The method of claim 9, wherein the borated polyethylene compound contains approximately 5% boron by weight.

13. The method of claim 9, wherein the isotopically enriched $^{11}$B compound comprises a boron oxide.

14. The method of claim 9, wherein the isotopically enriched $^{11}$B compound comprises a boron trihalide.

15. The method of claim 9, wherein the isotopically enriched $^{11}$B compound comprises a boron diethyletherate.

16. The method of claim 9, wherein the isotopically enriched $^{11}$B compound comprises a compound selected from the group consisting of: orthoborates (B(OR)$_3$), acyl borates (B(OCOR)$_3$), peroxo borates (B(OOR)3), boronic acids (RB(OH)$_2$), boron halides, boron hydrides, inorganic boranes, amine boranes, aminoboranes, boron-polymer composites, carboranes, and borazines, where R is an alkyl group.

17. A method of reducing soft error rates in semiconductor devices, the method comprising:
adding between 1% to 100% of isotopically enriched $^{11}$B compound to an adhesive.

18. The method of claim 17, wherein the isotopically enriched $^{11}$B compound comprises a compound containing at least 95% $^{11}$B.

19. The method of claim 17, wherein the isotopically enriched $^{11}$B compound comprises a $^{11}$B borated polyethylene compound.

20. The method of claim 19, wherein the borated polyethylene compound contains approximately 5% boron by weight.

21. The method of claim 17, wherein the isotopically enriched $^{11}$B compound comprises a boron oxide.

22. The method of claim 17, wherein the isotopically enriched $^{11}$B compound comprises a boron trihalide.

23. The method of claim 17, wherein the isotopically enriched $^{11}$B compound comprises a boron diethyletherate.

24. The method of claim 17, wherein the isotopically enriched $^{11}$B compound comprises a compound selected from the group consisting of: orthoborates (B(OR)3), acyl borates (B(OCOR)$_3$), peroxo borates (B(OOR)$_3$), boronic acids (RB(OH)$_2$), boron halides, boron hydrides, inorganic boranes, amine boranes, aminoboranes, boron-polymer composites, carboranes, and borazines, where R is an alkyl group.

25. The method of claim 17, wherein the adhesive comprises the adhesive used to bond a substrate to a flip chip.

26. The method of claim 17, wherein the adhesive comprises the adhesive used to bond a heat sink to a substrate.

27. The method of claim 17, wherein the adhesive comprises a die attach adhesive.

28. A method for reducing soft error rates in semiconductor devices, the method comprising:
adding between 1% to 100% of isotopically enriched $^{11}$B compound to a substrate, wherein the isotopically enriched $^{11}$B compound comprises a compound containing at least 95% $^{11}$B.

29. A method for reducing soft error rates in semiconductor devices, the method comprising:
adding between 1% to 100% of isotopically enriched $^{11}$B compound to a substrate, wherein the isotopically enriched $^{11}$B compound comprises a $^{11}$B borated polyethylene compound.

30. The method of claim 29, wherein the borated polyethylene compound contains approximately 5% boron by weight.

31. A method for reducing soft error rates in semiconductor devices, the method comprising:
adding between 1% to 100% of isotopically enriched $^{11}$B compound to a substrate, wherein the isotopically enriched $^{11}$B compound comprises a boron oxide.

32. A method for reducing soft error rates in semiconductor devices, the method comprising:
adding between 1% to 100% of isotopically enriched $^{11}$B compound to a substrate, wherein the isotopically enriched $^{11}$B compound comprises a boron trihalide.

33. A method for reducing soft error rates in semiconductor devices, the method comprising: adding between 1% to 100% of isotopically enriched $^{11}$B compound to a substrate, wherein the isotopically enriched $^{11}$B compound comprises a boron diethyletherate.

34. A method for reducing soft error rates in semiconductor devices, the method comprising:
adding between 1% to 100% of isotopically enriched $^{11}$B compound to a substrate, wherein the isotopically enriched $^{11}$B compound comprises a compound selected from the group consisting of: orthoborates (B(OR3)), acyl borates (B(OCOR)3), peroxo borates (B(OOR)3), boronic acids (RB(OH)2), boron halides, boron hydrides, inorganic boranes, amine boranes, aminoboranes, boron-polymer composites, carboranes, and borazines, where R is an alkyl group.

35. A method for reducing soft error rates in semiconductor devices, the method comprising:
packaging the semiconductor device in an isotopically enriched $^{11}$B boron-polymer composite material.

* * * * *